United States Patent
Sze

(10) Patent No.: US 6,187,626 B1
(45) Date of Patent: Feb. 13, 2001

(54) FORMING A SEMI-RECESSED CAPACITOR STRUCTURE IN AN INTER-POLYSILICON DIELECTRIC

(75) Inventor: Jhy-Jyi Sze, Tainan (TW)

(73) Assignee: United Microelectronics Corp., Hsin-Chu (TW)

(*) Notice: Under 35 U.S.C. 154(b), the term of this patent shall be extended for 0 days.

(21) Appl. No.: 09/495,244

(22) Filed: Jan. 31, 2000

(51) Int. Cl.[7] .................................................. H01L 21/8242
(52) U.S. Cl. .............................................. 438/253; 438/396
(58) Field of Search .................................. 438/238–240, 438/253–256, 381, 396–399

(56) References Cited

U.S. PATENT DOCUMENTS 6,103,568 * 8/2000 Fijiwara ................................. 438/253
6,103,586 * 8/2000 Chetlur et al. ......................... 438/396

* cited by examiner

Primary Examiner—Jey Tsai

(74) Attorney, Agent, or Firm—Harness, Dickey & Pierce, P.L.C.

(57) ABSTRACT

A method for forming a semi-recessed capacitor structure in an inter-polysilicon dielectric is disclosed. The method includes the following steps. First of all, a first oxide layer is formed. A first nitride layer is formed. Then, a second oxide layer is formed. Again, a second nitride layer is formed. Next, a third oxide layer is formed. Then, a first photoresist is formed. A portion of the third oxide layer, a portion of the second nitride layer, a portion of the second oxide layer and a portion of the first nitride layer are all etched. A first polysilicon layer is formed. Then, a portion of the first polysilicon layer is etched. A dielectric layer is formed. Next, a second photoresist layer is formed. Then, a portion of the dielectric layer, a portion of the third oxide layer, of the second nitride layer and some of the second oxide layer are etched. Then, a second polysilicon layer is deposited. Next, a portion of the second polysilicon layer is etched back. Finally, the dielectric layer and the third oxide layer are etched. Thus, the second polysilicon layer is remained into the second nitride layer and the second oxide layer, whereby completing the capacitor structure having the semi-recessed structure.

19 Claims, 7 Drawing Sheets

FORMING A SEMI-RECESSED CAPACITOR STRUCTURE IN AN INTER-POLYSILICON DIELECTRIC

BACKGROUND OF THE INVENTION

1. Field of the Invention

The invention relates to a method for forming a capacitor structure in an inter-polysilicon dielectric, more particularly for forming a semi-recessed capacitor structure in an inter-polysilicon dielectric.

2. Description of the Prior Art

In the prior art, first of all, as FIG. 1A, an inter-polysilicon dielectric layer 11 is deposited onto the surface of a semiconductor substrate 120. Especially, there is a cell 150 formed into the semiconductor substrate 120 already.

Consequentially, as FIG. 1B, a portion of the inter-polysilicon dielectric layer 11 is etched as an opening 180 by using the conventional dry etching. This opening 180 is a trapezoid-like structure, especially it owns the narrow lower and the wide upper structure.

Then, as FIG. 1C, the polysilicon layer 12 is deposited over the surface of the inter-polysilicon dielectric 11 and fills up the opening 180.

As the FIG. 1D, the portion of the polysilicon layer 12 is etched using the conventional dry etching to form a bottom plate of the capacitor. Here, the photoresist layer 162 is used as an etch mask. If the thin silicon nitride layer is formed on the surface of the polysilicon, the topographic effect of the silicon nitride layer will be produced, such as legend 170.

In the incubation time of the process, the thickness of nitride deposited on the oxide is thinner than the nitride deposited on the silicon. While the thickness of oxide-nitride-oxide layer is reduce, the topographic effect of the thin nitride deposition in the process will make the nitride thickness between the silicon and inter-polysilicon dielectric boundary becomes too thin, also this withstands the following wet oxidation process. At this time, grain boundary oxidation may occur at the neck of polysilicon via, which results in abnormal increment of node contact resistance.

SUMMARY OF THE INVENTION

In accordance with the present invention, a method is provided for forming a capacitor structure that substantially improves the topographic effect from the silicon nitride layer.

In the preferred embodiment, the silicon nitride layer located on the polysilicon dielectric layer and etching back a portion of the polysilicon layer can form the bottom plate of capacitor.

In the preferred embodiment, the thickness of silicon nitride layer can be reduced when the polysilicon layer is etching back.

In one embodiment, first of all, a first oxide layer is formed onto the surface of a semiconductor substrate. A first nitride layer is formed onto the surface of the first oxide layer. Then, a second oxide layer is formed onto the surface of the second nitride layer. Again, a second nitride layer is formed onto the surface of the second nitride layer. Next, a third oxide layer is formed onto the surface of the second nitride layer. Then, a first photoresist is formed onto the first nitride layer to define a first opening of a polysilicon via.

A portion of the third oxide layer, a portion of the second nitride layer, a portion of the second oxide layer and a portion of the first nitride layer are all etched using the first photoresist layer as an etch mask until the semiconductor substrate is exposed to form a first opening of the polysilicon via, that is a trapezoid-like opening having a wide upper and a narrow lower. The first photoresist is removed. A first polysilicon layer is formed on the surface of the semiconductor substrate and over the surface of the third oxide layer, wherein the first polysilicon layer fills up the first opening. Then, a portion of the first polysilicon layer is etched until the third oxide layer is exposed, whereby the surface of the first polysilicon layer is lower than the surface of the third oxide layer. A dielectric layer is formed over the surface of the polysilicon layer and the third oxide layer.

Next, a second photoresist layer is formed over the surface of the dielectric layer to define a capacitor region. Then, a portion of the dielectric layer, a portion of the third oxide layer, of the second nitride layer and some of the second oxide layer are etched until the rest of the second oxide layer is still remained. The second photoresist is removed. Then, a second polysilicon layer is deposited over the dielectric layer. Next, a portion of the second polysilicon layer is etched back using the first dielectric layer as a stop layer so that the surface of the second polysilicon layer is lower than the surface of the dielectric layer.

Finally, the dielectric layer and the third oxide layer are etched using the third oxide layer as a stop layer until the surface of the second nitride layer is exposed. Thus, the second polysilicon layer is remained into the second nitride layer and the second oxide layer, whereby completing the capacitor structure having the semi-recessed structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to a capacitor structure, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. It will briefly be noted here that substrate in FIGS. 2A to 2M. Normally, the method for forming a capacitor structure of a semiconductor will comprise the following steps.

Figure 1A:
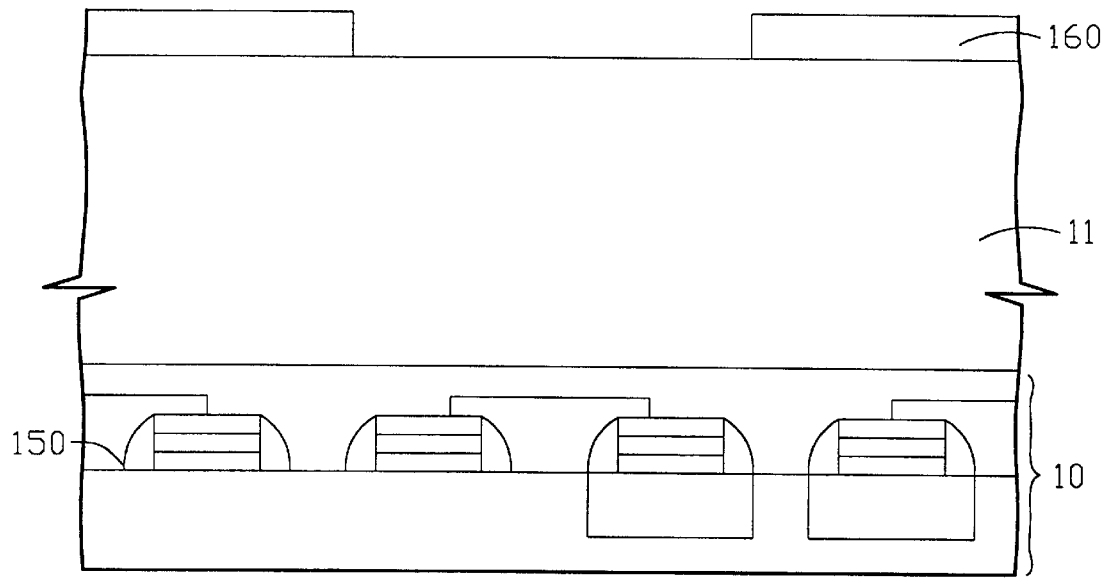
FIGS. 1A to 1D are illustrative of various components in the structure of the prior art.
Figure 1B:
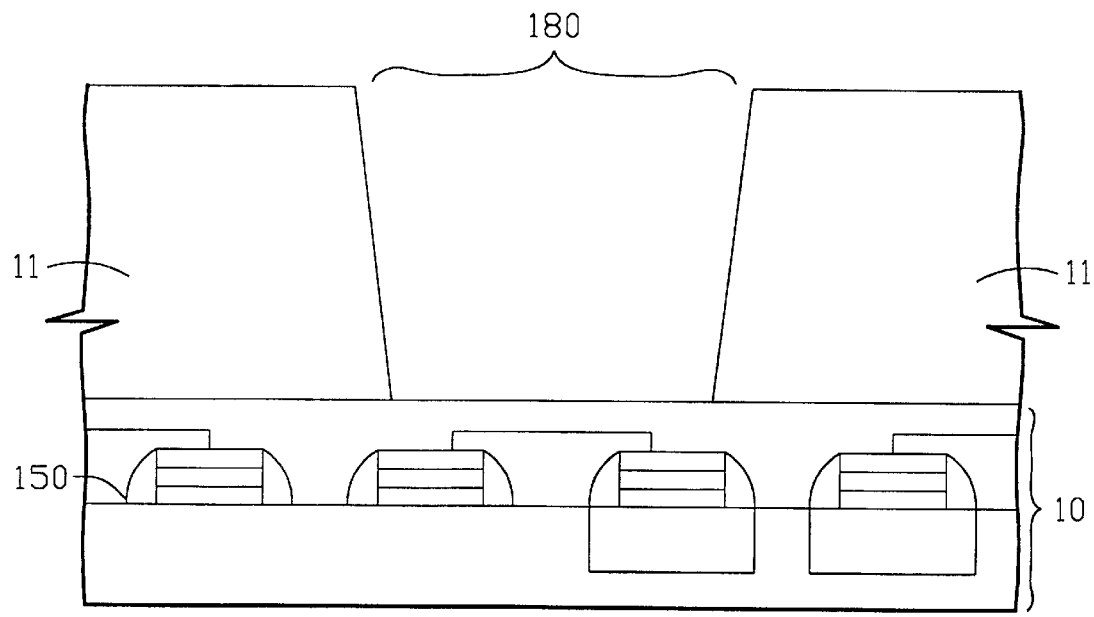
Figure 1C:
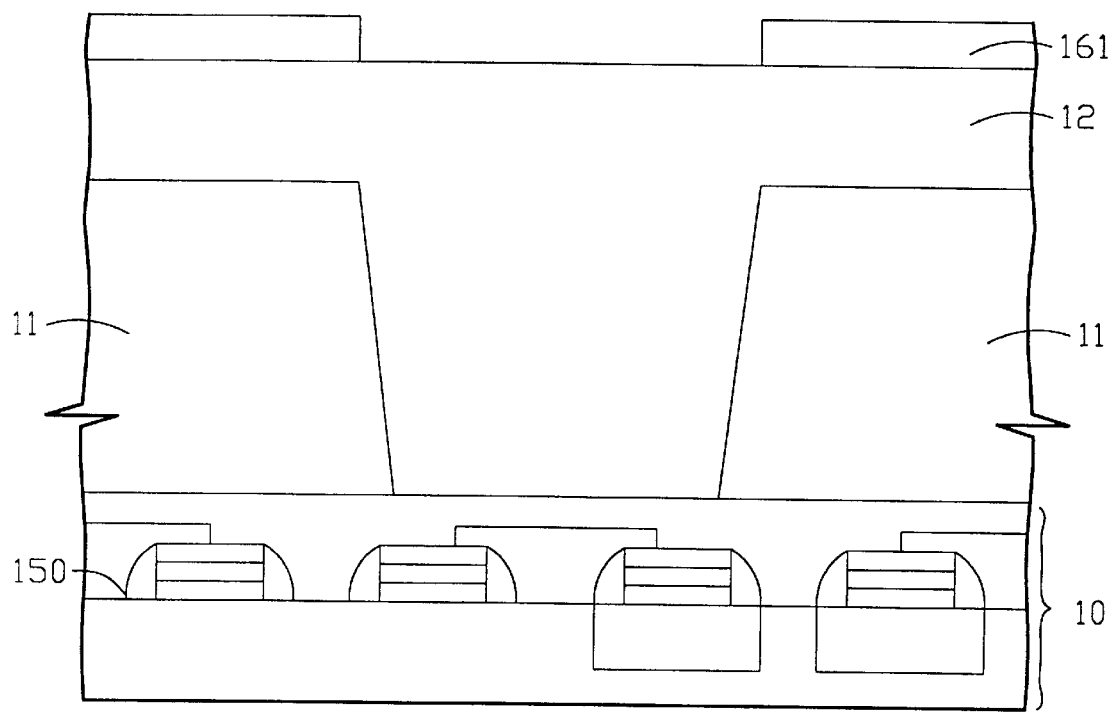
Figure 1D:
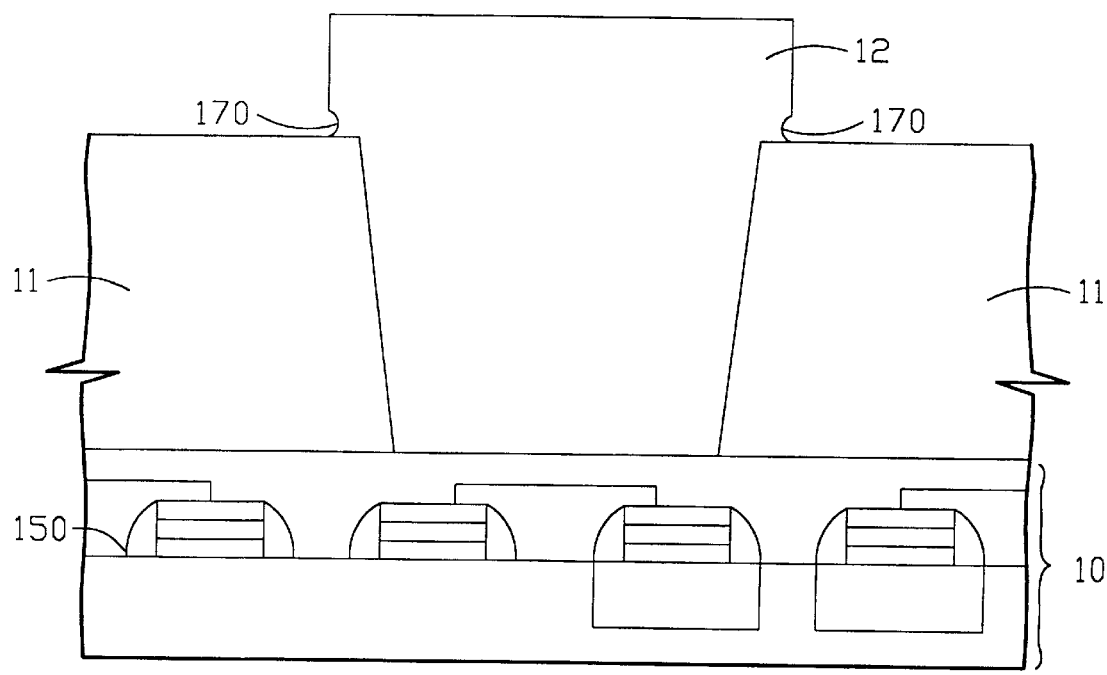
Figure 2A:
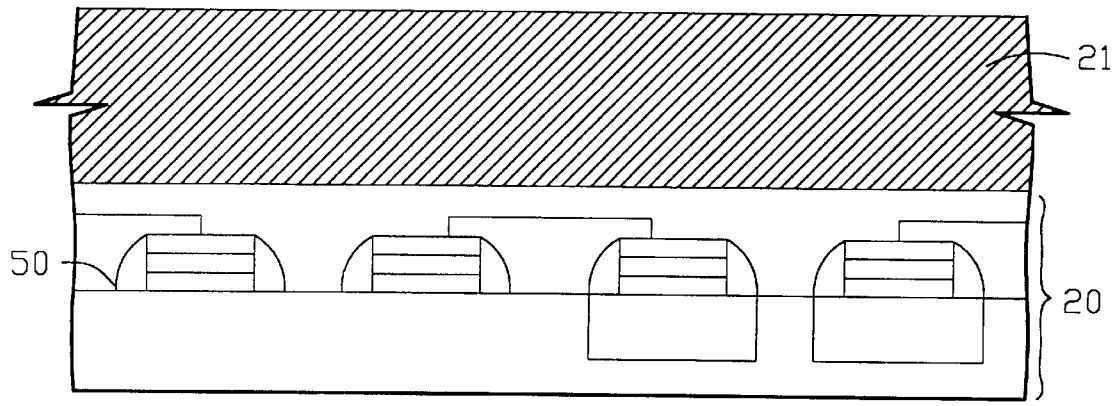
FIGS. 2A to 2J are schematic diagrams showing the structure of the present invention.

First of all, as FIG. 2A, a first oxide layer 21 such as silicon dioxide ($SiO_2$) is deposited onto the surface of a semiconductor substrate 20 such as silicon using the conventional chemical vapor deposition (CVD). Especially there is a cell 50 inside semiconductor substrate. The thickness of this first silicon dioxide layer is about 3000 angstroms, the formation temperature is controlled at about 400° C. to 800° C. and the pressure is at about few torrs to 100 mtorrs.

Figure 2B:
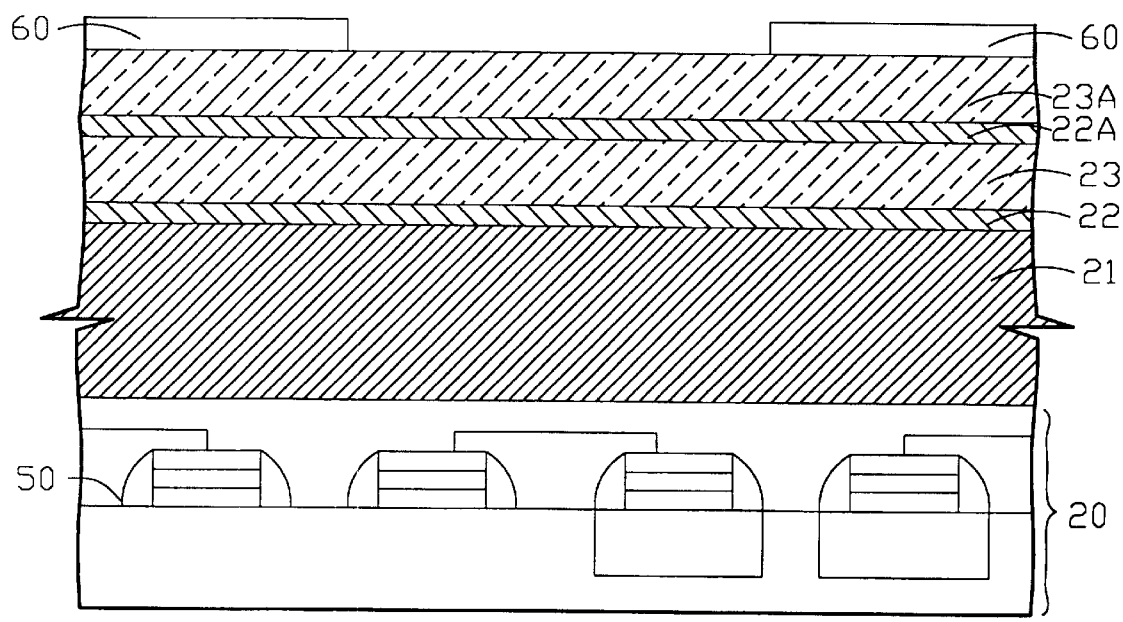

As FIG. 2B, a first nitride layer 22 such as silicon nitride (SiN) is formed onto the surface of the first silicon dioxide layer 21 using the conventional chemical vapor deposition. The thickness of this first silicon nitride layer 22 is about 80 angstroms, the formation temperature is controlled at about 400° C. to 800° C. and the pressure is at about few torrs to 100 mtorrs.

Then, as FIG. 2B, a second oxide layer 23 such as silicon dioxide is formed onto the surface of the first silicon nitride layer 22 using the conventional chemical vapor deposition. The thickness of this second silicon oxide layer 23 is about 2000 to 3000 angstroms, the formation temperature is controlled at about 400° C. to 800° C. and the pressure is at about few torrs to 100 mtorrs.

Again, as FIG. 2B, a second nitride layer 22A such as silicon nitride (SiN) is formed onto the surface of the second silicon dioxide layer 23 using the conventional chemical vapor deposition. The thickness of this second silicon nitride layer 22A is about 80 angstroms, the formation temperature is controlled at about 400° C. to 800° C. and the pressure is at about few torrs to 100 mtorrs.

As FIG. 2B, a third oxide layer 23A such as silicon dioxide is formed onto the surface of the second silicon nitride layer 22A using the conventional chemical vapor deposition. The thickness of this third oxide layer 23A is about 200 to 400 angstroms, the formation temperature is controlled at about 400° C. to 800° C. and the pressure is at about few torrs to 100 mtorrs. Then, a photoresist 60 is formed onto the first nitride layer to define an opening of a polysilicon via.

Figure 2C:
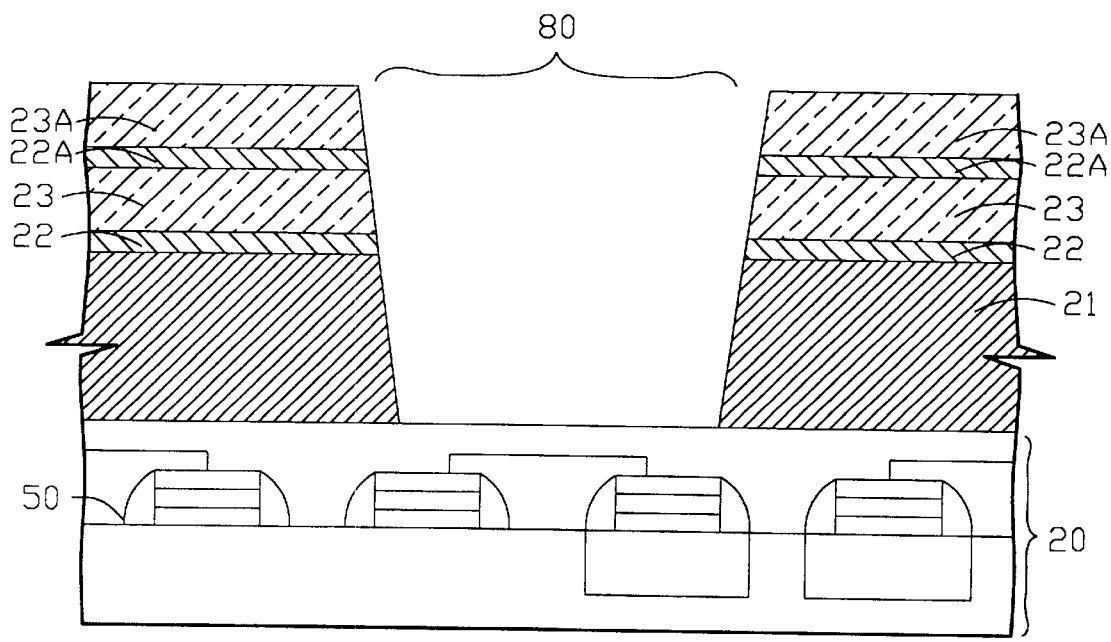

Consequentially, as FIG. 2C, a portion of the third oxide layer 23A, the second nitride layer 22A, the second oxide layer 23 and the first nitride layer 22 are all etched by using the conventional dry plasma etching until the semiconductor substrate 20 is exposed. Then, a first opening 80 of the polysilicon via is formed. This opening 80 is a trapezoid-like opening having a wide upper and a narrow lower structure. Here, the first photoresist layer 60 is used as an etch mask.

Figure 2D:
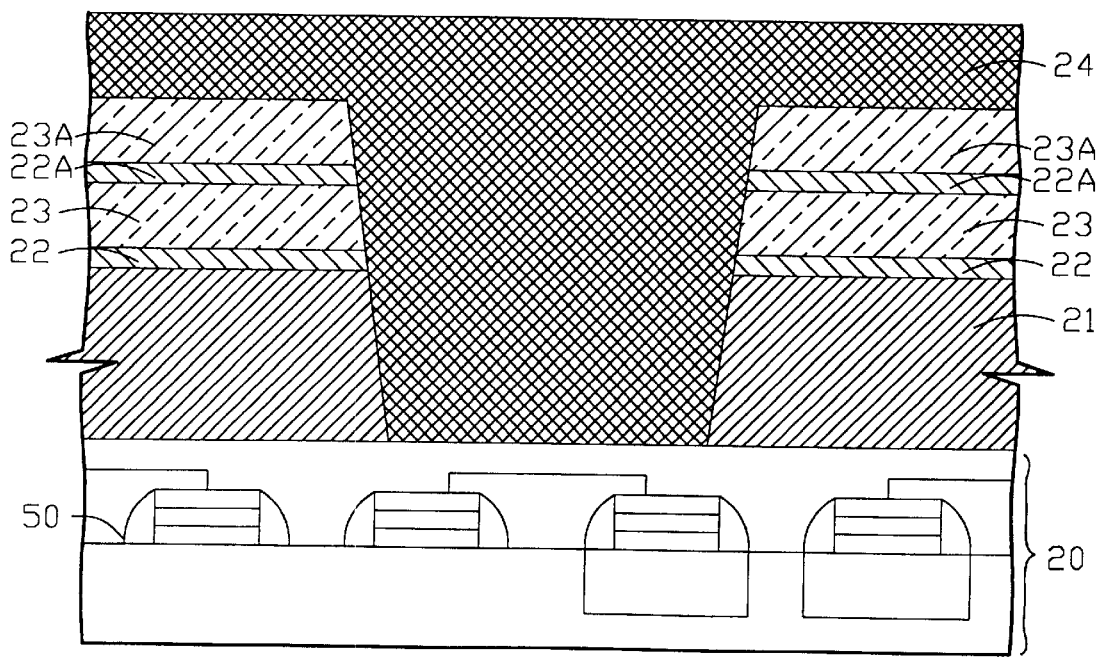

Then, as FIG. 2D, the first polysilicon layer (or amorphous silicon) 24 is formed on the surface of the semiconductor substrate 20 and over the surface of the third oxide layer 23A using the chemical vapor deposition. This first polysilicon layer 24 fills up into the first opening 80. The thickness between the surface of first polysilicon layer 24 to the surface of the third oxide layer 23A is about 1000 angstroms, the formation temperature is controlled at about 400° C. to 800° C. and the pressure is at about few torrs to 100 mtorrs.

Figure 2E:
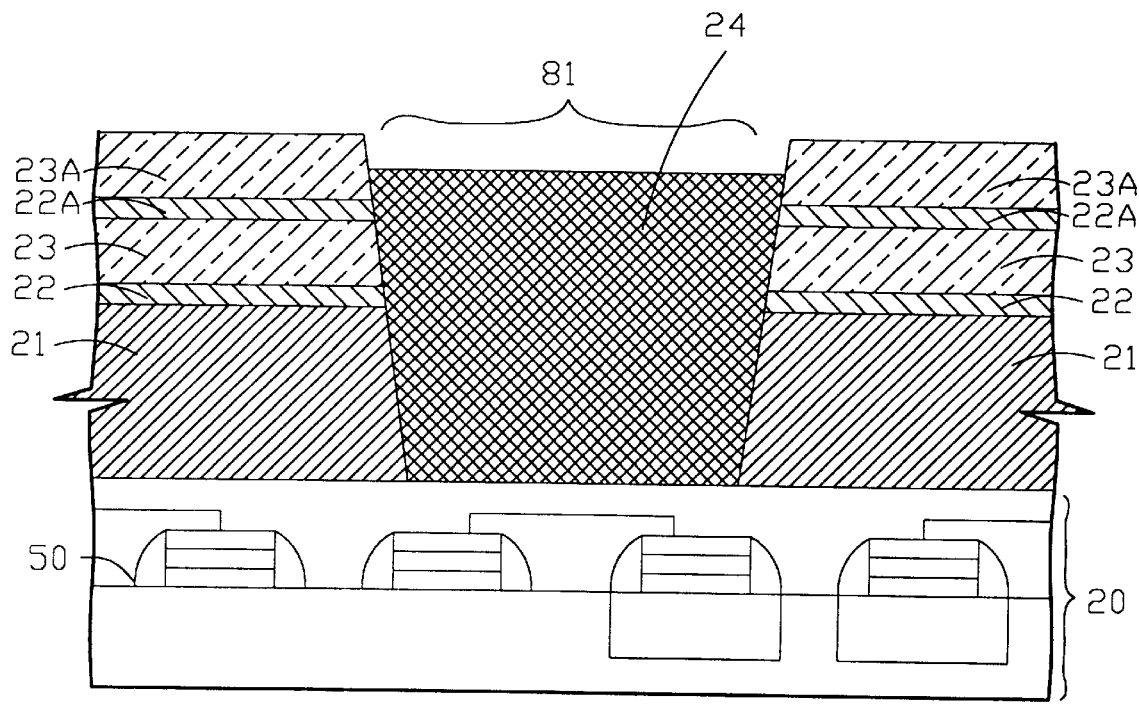

As FIG. 2E, by the conventional plasma dry etching, the portion of the first polysilicon layer 24 is etched until the surface of the third oxide layer 23A is exposed, as a second opening 81. The thickness of the third oxide layer 23A is higher than the surface of the first polysilicon layer 24.

Figure 2F:
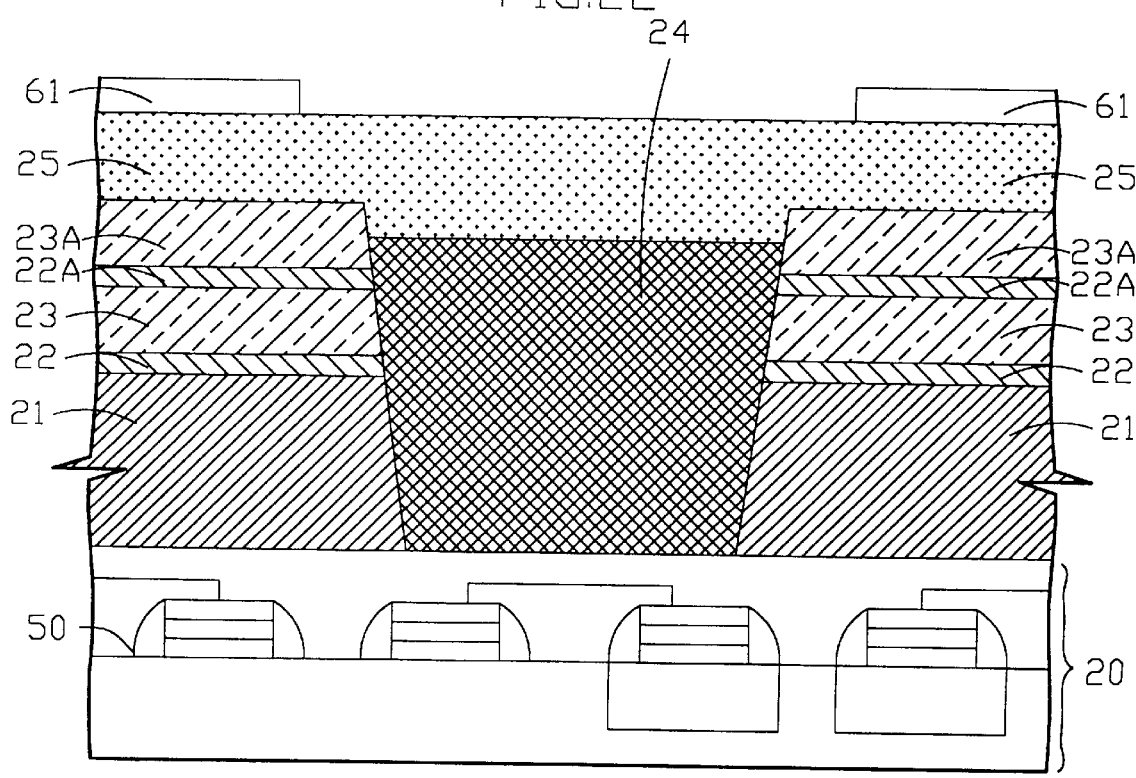

Next, as FIG. 2F, a boron phosphorus silicon glass (BPSG) layer 25 is blanket and conformably formed over the surface of the first polysilicon layer 24 and the surface of the third oxide layer 23A using the chemical vapor deposition. Also, the boron phosphorus silicon glass (BPSG) layer 25 can fill up the second opening 81. The thickness of the first polysilicon layer 24 to the surface of the boron phosphorus silicon glass layer 25 is about 10000 to 12000 angstroms. Due to the character of the boron phosphorus silicon glass layer 25 is quite smooth and is able to be used as a dielectric layer. The formation temperature of this boron phosphorus silicon glass layer 25 is controlled at about 850° C. A second photoresist 61 is formed on the boron phosphorus silicon glass layer 25 to define a capacitor region. Also, a phosphorus silicon glass layer (PSG) can replace as the boron phosphorus silicon glass layer.

Figure 2G:
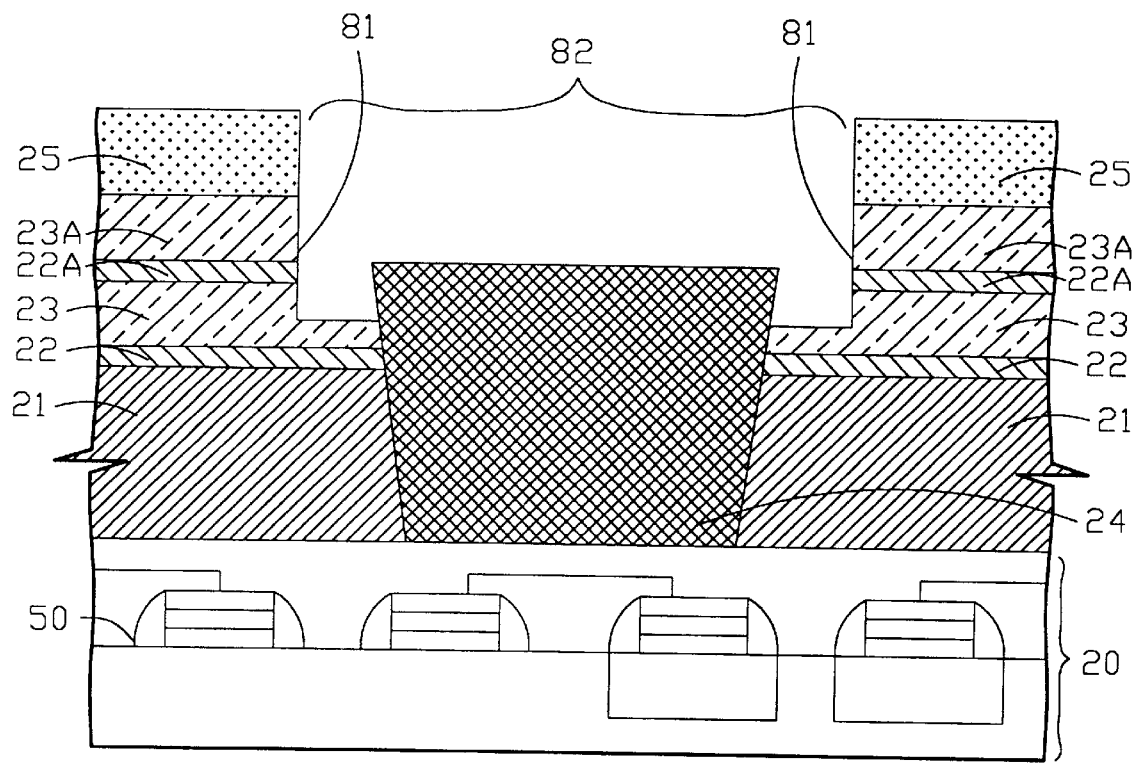

As FIG. 2G, by the conventional dry plasma etching, a portion of the boron phosphorus silicon glass layer 25 and a portion of the second oxide layer 23 are both etched until the rest of the second oxide layer 23 is remained. Thus, the third opening 82 is formed. The first polysilicon layer 24 is remained and formed as trapezoid-like structure that is a wide upper with a narrow lower structure.

Figure 2H:
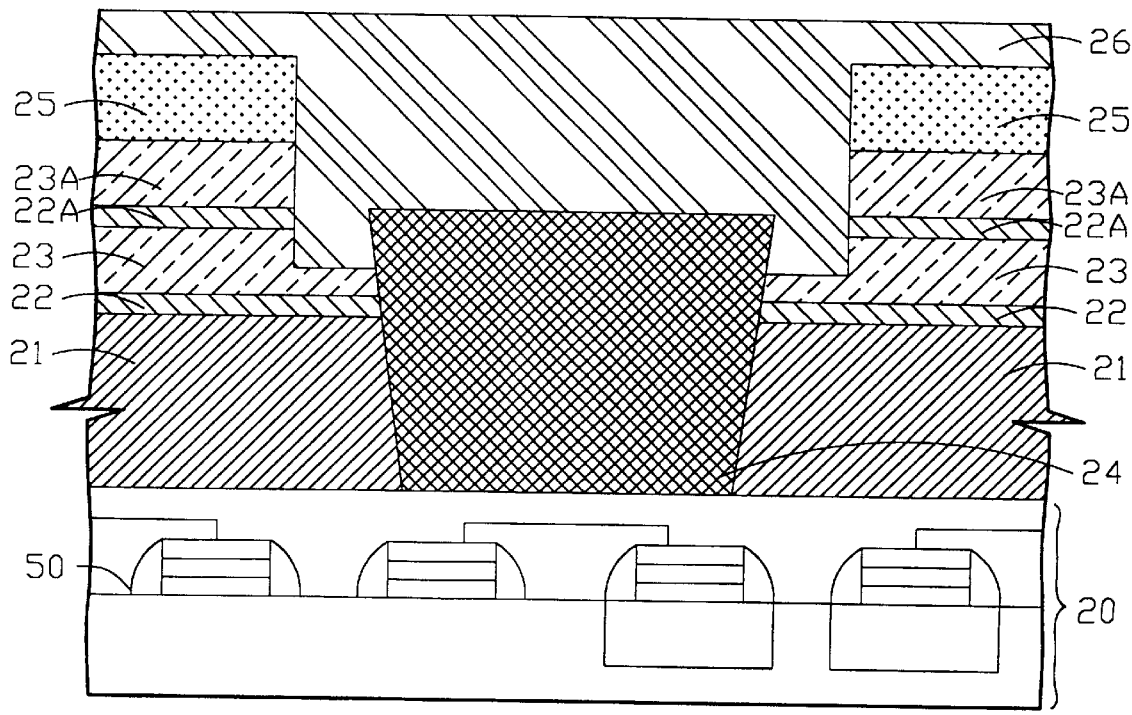

As FIG. 2H, by the chemical vapor deposition, a second polysilicon layer 26 is filled into the third opening 82 and is deposited over the surface of the boron phosphorus silicon glass layer 25. The thickness between second polysilicon layer 26 to the boron phosphorus silicon glass layer 25 is about 2000 to 3000 angstroms, the formation temperature of the second polysilicon layer is controlled at about 400° C. to 800° C. and the pressure is at about few torrs to 100 mtorrs.

Figure 2I:
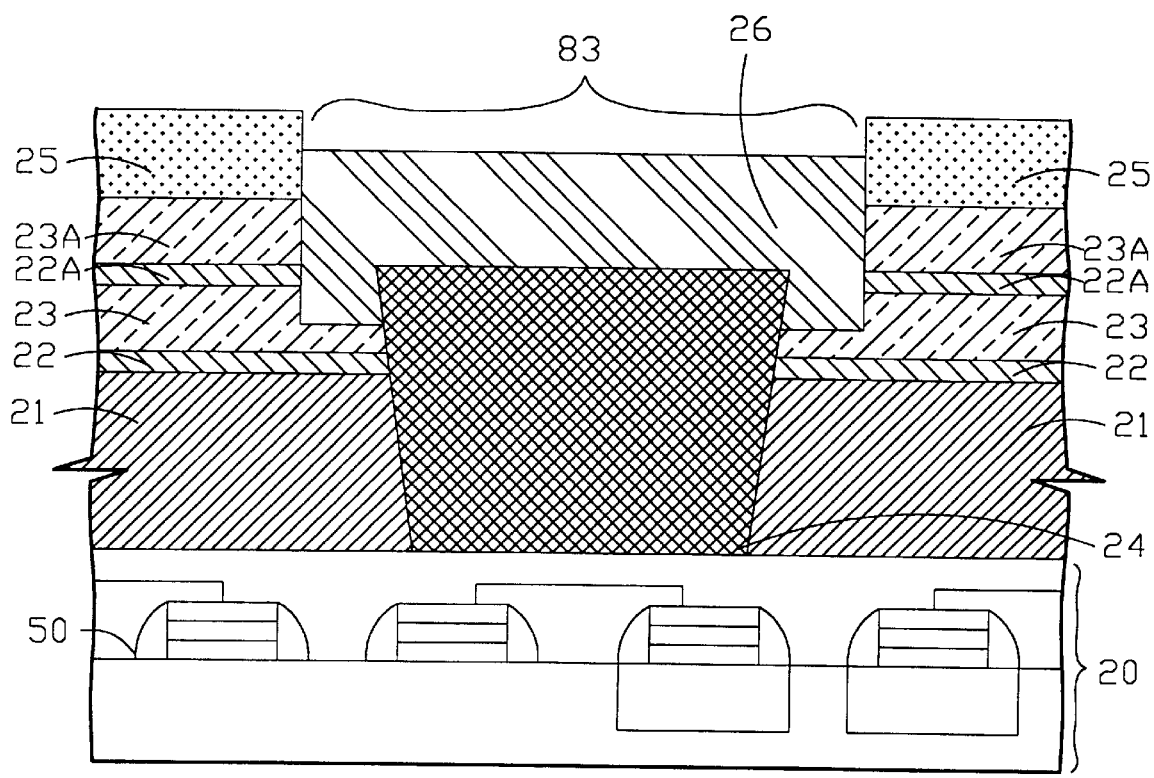

As FIG. 2I, by the dry plasma etching, a portion of the second polysilicon layer 26 is etched back using the first silicon nitride 22 as a stop layer until the fourth opening 83 is appeared. The thickness of the surface of the boron phosphorus silicon glass layer 25 is higher than the surface of the second polysilicon layer 26, so that the thickness is about 0.8 to 1 $\mu$m.

Figure 2J:
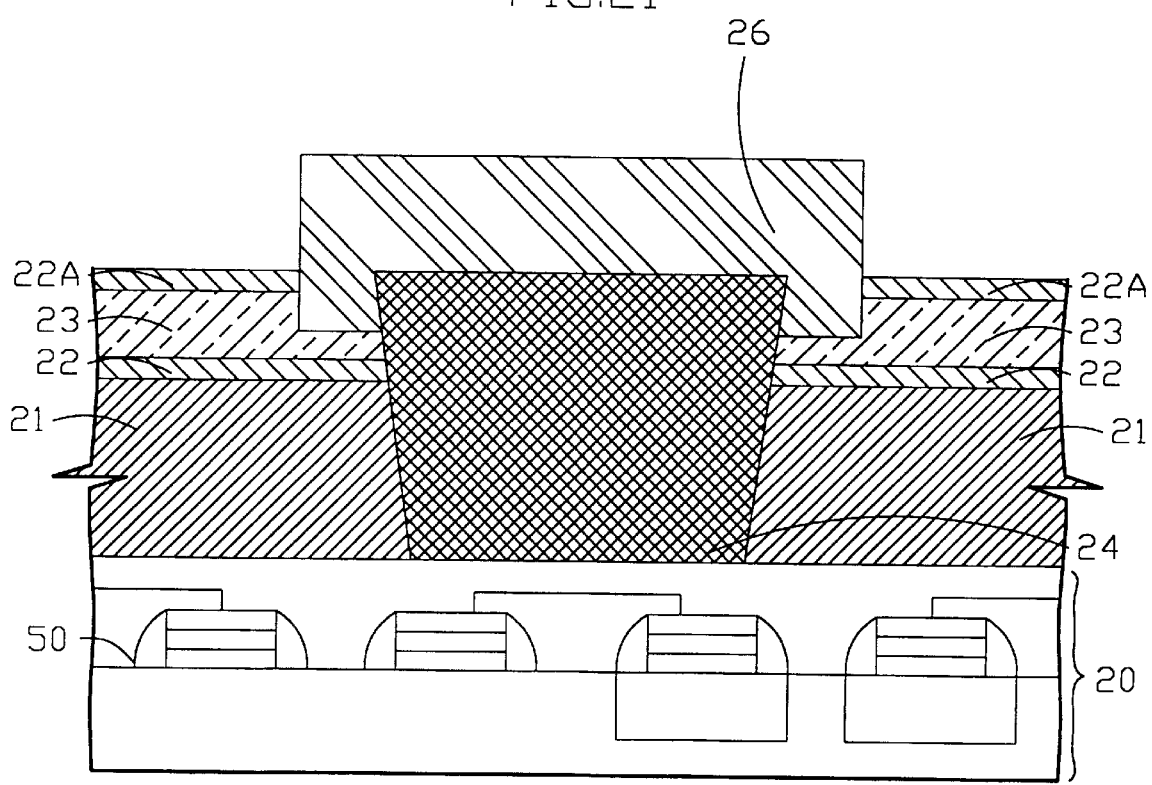

Finally, as FIG. 2J, the boron phosphorus silicon glass layer 25 and the third oxide layer 23A are all etched using the wet etching and using the third oxide layer 23A as a stop layer until the surface of the second oxide layer 22A is exposed. Thus, the second polysilicon layer 26 is remained into the second nitride layer 22A and the second oxide layer 23. Therefore, a capacitor structure is completed and there are a top plate structure and a bottom plate structure for the semi-recessed capacitor.

According to the preferred embodiment, this present invention can reduce the topographic effect from the silicon nitride layer. The silicon nitride layer located on the polysilicon dielectric layer and etching back a portion of the polysilicon layer can form the bottom plate of capacitor. Also the thickness of silicon nitride layer can be reduced when the polysilicon layer is etching back.

First of all, a first oxide layer is formed onto the surface of a semiconductor substrate. A first nitride layer is formed onto the surface of the first oxide layer. Then, a second oxide layer is formed onto the surface of the second nitride layer. Again, a second nitride layer is formed onto the surface of the second nitride layer. Next, a third oxide layer is formed onto the surface of the second nitride layer. Then, a first photoresist is formed onto the first nitride layer to define a first opening of a polysilicon via.

A portion of the third oxide layer, a portion of the second nitride layer, a portion of the second oxide layer and a portion of the first nitride layer are all etched using the first photoresist layer as an etch mask until the semiconductor substrate is exposed to form a first opening of the polysilicon via, that is a trapezoid-like opening having a wide upper and a narrow lower. The first photoresist is removed. A first polysilicon layer is formed on the surface of the semiconductor substrate and over the surface of the third oxide layer, wherein the first polysilicon layer fills up the first opening. Then, a portion of the first polysilicon layer is etched until the third oxide layer is exposed, whereby the surface of the first polysilicon layer is lower than the surface of the third oxide layer. A dielectric layer is formed over the surface of the polysilicon layer and the third oxide layer.

Next, a second photoresist layer is formed over the surface of the dielectric layer to define a capacitor region. Then, a portion of the dielectric layer, a portion of the third oxide layer, of the second nitride layer and some of the second oxide layer are etched until the rest of the second oxide layer is still remained. The second photoresist is removed. Then, a second polysilicon layer is deposited over the dielectric layer. Next, a portion of the second polysilicon layer is etched back using the first dielectric layer as a stop layer so that the surface of the second polysilicon layer is lower than the surface of the dielectric layer.

Finally, the dielectric layer and the third oxide layer are etched using the third oxide layer as a stop layer until the surface of the second nitride layer is exposed. Thus, the second polysilicon layer is remained into the second nitride layer and the second oxide layer, whereby completing the capacitor structure having the semi-recessed structure.

Although specific embodiments have been illustrated and described, it will be obvious to those skilled in the art that various modifications may be made without departing from what is intended to be limited solely by the appended claims.

What is claimed is:

1. A method for forming a semi-recessed capacitor structure in an inter-polysilicon dielectric layer, comprising:

forming a first oxide layer on the surface of a semiconductor substrate;

forming a first dielectric layer on the surface of the first oxide layer;

forming a second oxide layer on the surface of the first dielectric layer;

forming a first photoresist layer on the surface of the second oxide layer to define a first opening as a polysilicon via;

etching a portion of the second oxide layer, a portion of the first dielectric layer and a portion of the first oxide layer using the first photoresist as an etching mask until the surface of the semiconductor substrate being exposed to form the first opening;

forming a first conductive layer on the surface of the semiconductor substrate and over the surface of the second oxide layer, wherein the first conductive layer fills up the first opening of the polysilicon via;

etching a portion of the first conductive layer until the second oxide layer being exposed, whereby the surface of the first conductive layer being lower than the surface of the second oxide layer;

forming a second dielectric layer over the surface of the first conductive layer and the second oxide layer;

forming a second photoresist layer over the surface of the second dielectric layer to define a capacitor region;

etching a portion of the second dielectric layer and a portion of said first dielectric layer until some of the first dielectric layer being remained;

depositing a second conductive layer over said second dielectric layer to cover the surface of said second dielectric layer;

etching back a portion of said second conductive layer so that the surface of the second conductive layer being lower the surface of the second dielectric layer, whereby the first dielectric layer being as a stop layer;

etching the second dielectric layer and the second oxide layer until the bottom surface of the first dielectric layer being exposed, so that some of the second conductive layer remains in the dielectric layer, whereby completing the capacitor structure having the semi-recessed capacitor structure.

2. The method according to claim 1, wherein the semiconductor substrate comprises silicon.

3. The method according to claim 1, wherein the first oxide layer comprises silicon dioxide.

4. The method according to claim 1, wherein said first dielectric layer comprises oxide-nitride-oxide layer.

5. The method according to claim 1, wherein the first conductive layer comprises polysilicon layer.

6. The method according to claim 1, wherein said etching a portion of the first oxide layer comprises dry plasma etch.

7. The method according to claim 1, wherein the second dielectric layer comprises boron phosphorus silicon glass.

8. The method according to claim 7, wherein the second dielectric layer further comprises phosphorus silicon glass layer.

9. The method according to claim 1, wherein the second conductive layer comprises polysilicon layer.

10. The method according to claim 1, wherein said etching the second dielectric layer and said etching second oxide layer comprises $HPO_3$ etching.

11. A method for forming a semi-recessed capacitor structure in an inter-polysilicon dielectric, comprising;

forming a first oxide layer onto the surface of a semiconductor substrate;

forming a first nitride layer onto the surface of the first oxide layer;

forming a second oxide layer onto the surface of the first nitride layer;

forming a second nitride layer onto the surface of the second oxide layer;

forming a third oxide layer onto the surface of the second nitride layer;

forming a first photoresist onto the third oxide layer to define a first opening as a polysilicon via;

etching a portion of the third oxide layer, a portion of the second nitride layer, a portion of the second oxide layer, a portion of the first nitride layer and a portion of the first oxide layer using the first photoresist layer as an etch mask until the semiconductor substrate being exposed to form a first opening of the polysilicon via;

removing the first photoresist;

forming a first polysilicon layer on the surface of the semiconductor substrate and over the surface of the third oxide layer, wherein the first polysilicon layer fills up the first opening;

etching a portion of the first polysilicon layer until the third oxide layer being exposed, whereby the surface of the first polysilicon layer being lower than the surface of the third oxide layer;

forming a dielectric layer over the surface of the first polysilicon layer and the third oxide layer;

forming a second photoresist layer over the surface of the dielectric layer to define a capacitor region;

etching a portion of the dielectric layer, a portion of the third oxide layer, a portion of the second nitride layer and some of the second oxide layer until some of the rest of the second oxide layer being remained;

removing the second photoresist;

depositing a second polysilicon layer over the dielectric layer to cover the surface of the second dielectric layer;

etching back a portion of the second polysilicon layer using the first dielectric layer as a stop layer so that the surface of the second polysilicon layer being lower than the surface of the dielectric layer;

etching the dielectric layer and the third oxide layer using the third oxide layer as a stop layer until the surface of the second nitride layer being exposed, so that some of the second polysilicon layer remains in the second nitride layer and the second oxide layer, whereby completing the capacitor structure having the semi-recessed capacitor structure.

12. The method according to claim 11, wherein the semiconductor substrate comprises silicon.

13. The method according to claim 11, wherein the first oxide layer comprises silicon dioxide.

14. The method according to claim 11, wherein the first nitride layer comprises silicon nitride.

15. The method according to claim 11, wherein said etching a portion of the third oxide layer, the second nitride layer, the second oxide layer and the first nitride layer comprises dry plasma etch.

16. The method according to claim 11, wherein said removing a portion of the first polysilicon layer comprises dry plasma etch.

17. The method according to claim 11, wherein the dielectric layer comprises boron phosphorus silicon glass.

18. The method according to claim 17, wherein the dielectric layer further comprises phosphorus silicon glass.

19. The method according to claim 11, wherein said etching the dielectric layer and the third oxide layer comprises $HPO_3$ etching.

* * * * *